United States Patent
Parimi et al.

(10) Patent No.: US 7,926,012 B1
(45) Date of Patent: Apr. 12, 2011

(54) DESIGN-FOR-TESTABILITY PLANNER

(75) Inventors: Nitin Parimi, Endicott, NY (US);
Patrick Gallagher, Endicott, NY (US);
Brian Foutz, Endicott, NY (US); Vivek Chickermane, Endicott, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 375 days.

(21) Appl. No.: 11/951,571

(22) Filed: Dec. 6, 2007

(51) Int. Cl.
*G06F 9/455* (2006.01)
*G06F 17/50* (2006.01)

(52) U.S. Cl. ........ 716/106; 716/107; 716/108; 716/109; 716/111; 702/108; 702/109; 702/110; 702/111; 702/112; 702/117; 702/126; 714/25; 714/57; 714/724; 714/742; 324/76.66; 324/76.67; 324/93; 324/96

(58) Field of Classification Search .................. 716/4–6, 716/106–109, 111; 702/108–112, 117–126; 714/25–27, 724–742; 324/76.66, 76.67, 324/93–96
See application file for complete search history.

(56) References Cited

U.S. PATENT DOCUMENTS

| | | | | |
|---|---|---|---|---|
| 5,629,878 | A  * | 5/1997 | Kobrosly | 702/120 |
| 6,341,361 | B1 * | 1/2002 | Basto et al. | 714/726 |
| 6,678,875 | B2 * | 1/2004 | Pajak et al. | 716/11 |
| 6,742,166 | B2 * | 5/2004 | Foster et al. | 716/106 |
| 7,376,876 | B2 * | 5/2008 | Raul et al. | 714/738 |

OTHER PUBLICATIONS

Lehner, Testing Stratergy Planning—A tool to support future CAD Systems, 1991, ACM, p. 343-351.*
Parimi, N., Gallagher, P., and Foutz, B. "Planning Design-For-Test Synthesis Using a Unified Framework," Cadence Technical Conference, 2007, Endicott, NY.

* cited by examiner

*Primary Examiner* — Nghia M Doan
(74) *Attorney, Agent, or Firm* — Sheppard Mullin Richter & Hampton LLP

(57) ABSTRACT

A method is provided to improve the usability of Design-For-Testability Synthesis (DFTS) tools and to increase the design process productivity. The method comprises receiving a list of testability and design impact analysis functions, to be performed on the circuit, also referred to as a device under test (DUT). The impact analysis leads to the creation of logical transformations, which can be selected by a user with one or more available transformation methods from a list including, but not limited to, boundary scan test logic insertion, scan test logic insertion, memory BIST (built-in-self-test) logic insertion, and logic BIST logic insertion, and scan test data compression insertion logic insertion.

18 Claims, 11 Drawing Sheets

```
# Global variables
TOP_MODULE_NAME=DLX_TOP_NOSHARE_BIDI

# Port names and port keywords
DLX_CHIPTOP_TEST_ENABLE
BDY_IN=PAD_DLX_CHIPTOP_TEST_ENABLE/C \
    CELL=PDUDGZ \
    SYS_USE=INPUT
```

Share Groupings for Memory Instances

| Share Group | Instance | Clk Pin | Clk Pin Freq. | Internal Clk Freq. |
|---|---|---|---|---|
| 1 | /top/hier1/mem1 | clk | 100 | 250 |
| 1 | /top/hier1/mem1 | clk | 100 | 250 |
| 1 | /top/mem3 | clk | 100 | 250 |
| 2 | /top/hier1/hierB/hierII/mem4 | clk | 100 | 125 |
| 3 | /top/hier2/mem5 | clkA | 100 | 100 |
| 3 | /top/hier2/hierA/mem6 | clkA | 100 | 100 |

FIG. 6

DESIGN-FOR-TESTABILITY PLANNER

TECHNICAL FIELD

The present invention relates to the testing of circuits, and more particularly, some embodiments relate to a system and method for testing a circuit using an interface that combines the functionality of a plurality of DFT syntheses.

DESCRIPTION OF THE RELATED ART

Design-For-Testability (DFT) is emerging as an increasingly important facet of circuit design. Constraints on cost and time to market are becoming more stringent, requiring complex circuits with ever-decreasing device geometries to be designed in the allotted time. The proliferation of DFT approaches to address the issue of circuit quality has made the task of satisfying and managing these constraints more challenging. Compromising any DFT practice will affect circuit quality, which may lead to defects, added cost and schedule delays. Therefore, test engineers are constantly attempting to develop efficient test methodologies to successfully meet these constraints. A prerequisite for this process is a thorough knowledge of existing test tools, methodologies and their impacts to the design, which has become a daunting requirement due to increasing tool complexity.

DFT methodologies, in their current state, do not provide users an option to view all of the available DFT synthesis (DFTS) options and how they interrelate. DFTS options have traditionally been isolated from one another and have been dispersed throughout different complex DFT tools, making it a cumbersome process to manage them. This discontinuity also introduces difficulties in the overall planning of DFT and monitoring of test synthesis approaches. Additionally, due to the minimal connection and interaction between DFTS tools, errors that are incurred early in synthesis flows may go undetected until much later in the design process, resulting in inefficient execution of test methodologies.

BRIEF SUMMARY OF EMBODIMENTS OF THE INVENTION

The present invention is, in some embodiments, directed to methods, systems, and computer program products for performing tests on a circuit. The method comprises of a function which receives a list of testability and design impact analysis functions, to be performed on the circuit, also referred to as a device under test (DUT). This analysis leads to the creation of logical transformations, which can be selected by a user with one or more available transformation methods from a list including, but not limited to, boundary scan test logic insertion, scan test logic insertion, memory BIST (built-in-self-test) logic insertion, and logic BIST logic insertion, and scan test data compression insertion logic insertion. The method further comprises of a function that requests and receives test parameters to exercise each of the listed logical transformations selected, and to generate a setup/configuration file based on the received parameters. The setup file can be used to configure one or more tools to perform each of the tests selected. Once the one or more tools are configured, the DUT can then be tested using one or more tools.

In one embodiment, the method comprises of a function to perform a testability and design impact analysis. This analysis performs analyses on the selected test plan and calculates the impacts on the design, such as, but not limited to, power impact, area impact, and timing impact. This allows design architects to preview the tradeoffs between benefits and impacts of various design parameter selections, before committing to a methodology and implementing logic transformations.

In another embodiment, the method comprises of a function to perform an error check on the received test parameters. The error checking function may check for syntax, format error, and conflict between the selected functions on each test parameter entered by the user.

In yet another embodiment, the method invokes a plurality of tools or software applications to perform each of the test-related tasks selected by the user. In one embodiment, the method invokes a unique tool for each test feature. Further, the method can include a function to distribute any test parameter to one or more of the tools or software applications such that it eliminates the need for duplicative data entry.

In yet another embodiment, the method invokes tools to perform, but not limited to, the following tasks: boundary scan analysis and insertion; memory BIST analysis and insertion, scan chain analysis and insertion, test compression analysis and insertion, and logic BIST analysis and insertion.

In accordance with yet another embodiment of the invention, a computer aided design apparatus for performing test on a circuit is provided. The apparatus includes a plurality of testing tools configured to perform test on the circuit; a graphical user interface; and a processor coupled to the graphical user interface. The processor is configured to: solicit from a user a list of tests to perform on the circuit using the graphical user interface; solicit from the user test parameters for the solicited list of tests using the graphical user interface; and configure one or more the plurality of testing tools to perform the solicited list of tests using the solicited test parameters.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The figures are provided for purposes of illustration only and merely depict typical or example embodiments of the invention. These drawings are provided to facilitate the reader's understanding of the invention and shall not be considered limiting of the breadth, scope, or applicability of the invention.

FIG. 4B illustrates an example of the content in the specification file according to one embodiment of the present invention.

FIG. 5 illustrates an example 1149.1 interface of the DFT Planner according to one embodiment of the present invention.

FIG. 6 illustrates an example table of clocks and memory configurations according to one embodiment of the present invention.

DETAILED DESCRIPTION OF THE EMBODIMENTS OF THE INVENTION

1.0 Overview

Traditional DFT synthesis applications have focused on a point-tool approach. For example, there is one tool for inserting 1149.1-compliant boundary scan, another tool for inserting memory BIST, another tool to insert scan, and perhaps yet another tool that supports scan compression insertion. This is the case with some DFT CAD tool vendors. For example, Synopsys, Inc. of California offers DFT Compiler® for scan chain synthesis, DFT MAX® for compression insertion, and BSD Compiler® for boundary scan insertion. Mentor Graphics, Inc. of Oregon produces a suite that includes DFTAdvisor® for scan chain insertion, TestKompress® for compression insertion, MBISTArchitect® for memory BIST insertion, and BSDArchitect® for boundary scan insertion. Since most DFT CAD tool vendors do not offer synthesis solutions in all areas of DFT, a unified structure is needed to merge the functionalities of these various tools into a single synthesis methodology.

As described above, many commands and tools may be needed to perform different tests. As such, users may need to setup different control files for each command/tool. In many cases, the information the user needs to provide would be similar or overlap across different DFT synthesis, but would be in a slightly different format. For example, for boundary scan insertion, it may be necessary to specify which pins are shared or dedicated for test, so that boundary scan cells can be inserted only as needed. However, when inserting scan chains, these same ports are again listed as the scan chain begin and end ports. This unnecessarily increases the effort needed to perform DFT synthesis. In one embodiment, DFT Planner (DFTP) can be configured to streamline the planning, specification, review, and analysis of the test-related methodologies by providing an environment where various DFTS methodologies can cooperatively interact and test the DUT. As a result, DFT Planner can be implemented in one embodiment to remove many of the complexities in the iterative process of designing, planning, and implementing DFT synthesis. With DFT Planner, circuit designers may efficiently use synthesis tools such as, for example, Cadence RTL Compiler and Encounter Test to perform DFT insertion, scan chain synthesis, compression insertion, boundary scan insertion, scan chain insertion, DFT analysis, automatic test pattern generation (ATPG), and fault diagnostics.

2.0 DFT Planner

Figure 1:
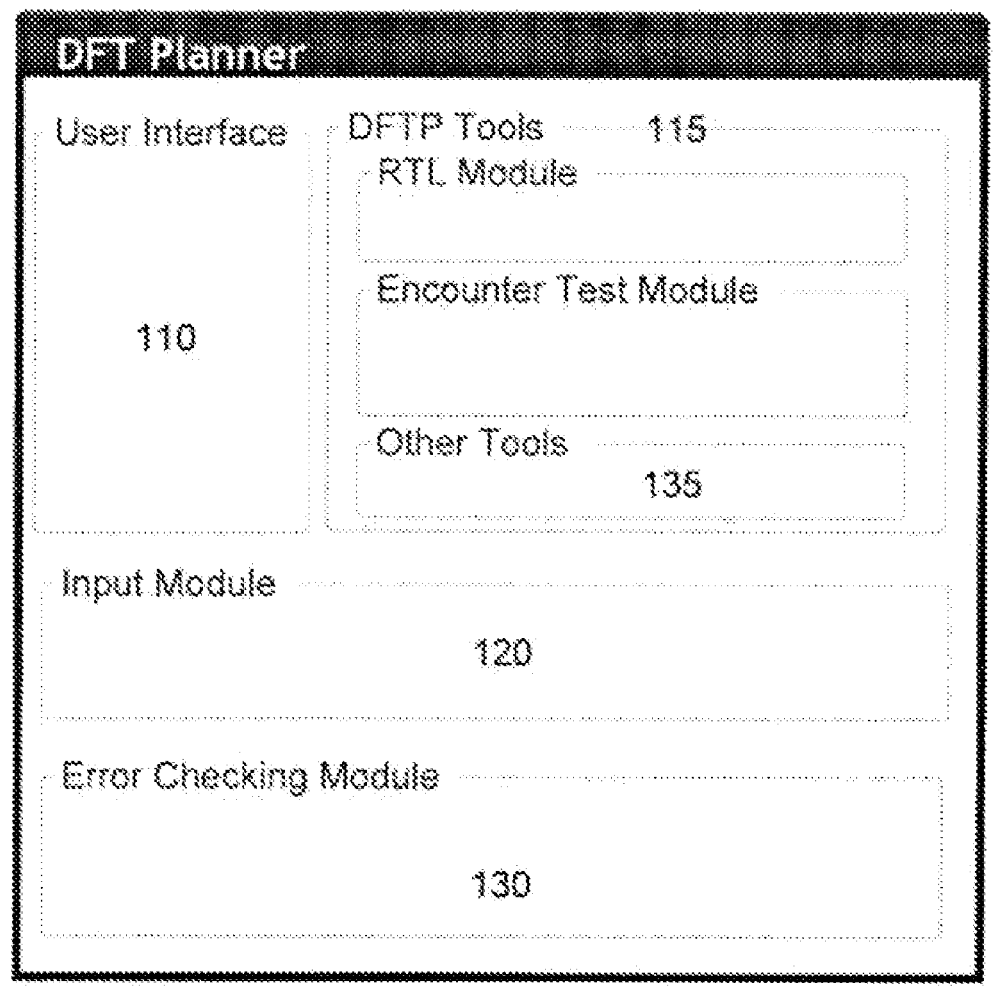
FIG. 1 illustrates an example DFT Planner application according to one embodiment of the present invention.
Figure 1:
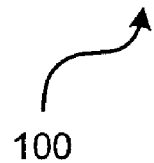

FIG. 1 illustrates DFT planner application 100 according to one embodiment of the present invention. DFT Planner application 100 may be a stand alone application or an application integrated to an electronic design automation (EDA) software running on a computer or computing system. As illustrated in FIG. 1, DFTP 100 includes a user interface 110, a DFTP tools module 115, an input module 120, and an error checking module 130.

On a high level, user interface 110 can be configured to assist the user to organize and gather information needed to plan DFT synthesis and to execute the proper tools for performing one or more of the test syntheses defined by the user. In one embodiment, the planned DFT synthesis is executed using DFTP tools module 115 which may contain tools such as, but not limited to, Cadence RTL, Encounter Test, and other synthesis tool 135.

In one embodiment, input module 120 can be configured to gather information needed to perform one or more of the test syntheses. Input module 120 is also configured to distribute any of the gathered information that is needed by more than one test synthesis components. In this way, the user does not have to repeatedly enter the same information.

In one embodiment, prior to executing the planned test synthesis, error checking module 130 performs a check for errors such as, for example, syntax and format errors, and conflict between the selected functions on each test parameter entered by the user. Error checking module 130 will be discussed in detail below. Other tool module 135 may contain additional test synthesis such as, for example, compression insertion test, which will be discussed in detail below.

2.1 High Level Design Flow

Figure 2:
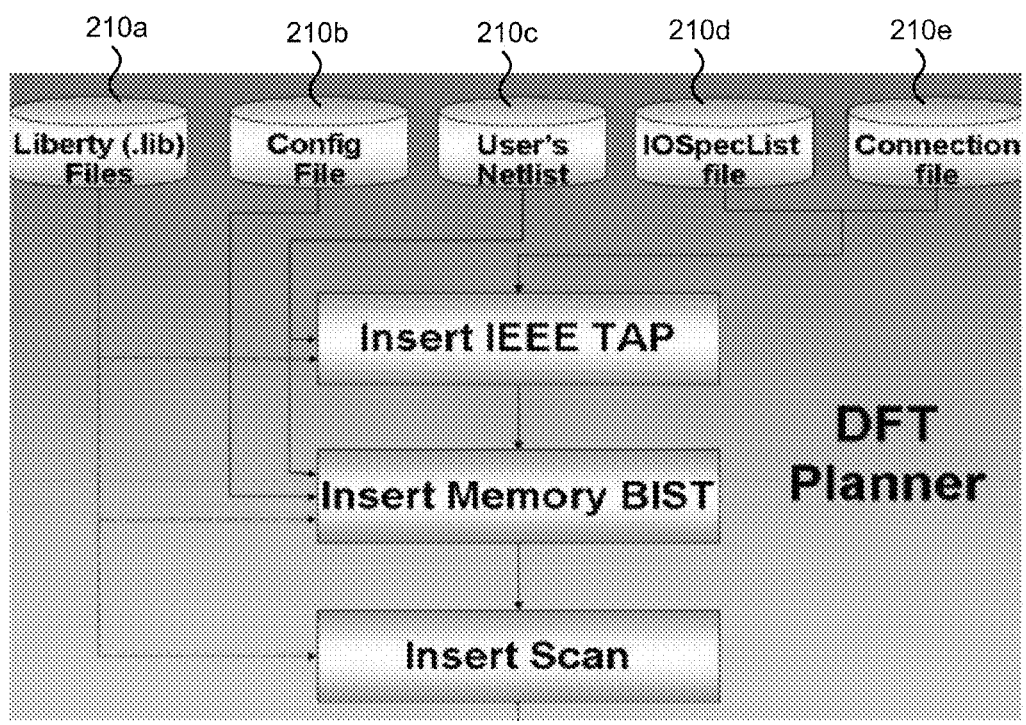
FIG. 2 illustrates an example flow diagram of the DFT Planner according to one embodiment of the present invention.

FIG. 2 illustrates an example design flow diagram 200 implemented by DFT planner 100 according to one embodiment of the present invention. The example flow diagram 200 illustrated in FIG. 1 includes five input data files 210a-e. These input files may have various formats. Each of the data files 210a-e may contain startup and configuration information necessary to perform the plurality of DFT syntheses such as, for example, boundary scan, insertion scan, compression insertion, scan chain insertion, memory BIST, and logical BIST. DFT operations are also referred to herein, collectively or individually, as test synthesis components. As shown in FIG. 1, the three logic transformations to be performed are insert IEEE TAP (boundary scan insertion), insert memory BIST, and insert scan. It should be noted that additional test synthesis components could be implemented in addition to the three syntheses shown. When performing boundary scan insertion, a user is typically required to enter parameters for a design netlist, the top module name of the design, and synthesis libraries for I/O cells. As will be apparent below, DFTP can be implemented to simplify the data entry process for users by intuitively making requests for test parameters and commands using a user interface. In this way, some or preferably all of the required information, parameters, and commands are collected at one point. Accordingly, one embodiment can be provided to simplify and optimize the planning and managing of the entire test methodology.

Referring again to FIG. 200, file 210a is a library file which contains a collection of technology library files. File 210b is a configuration file for the insert memory BIST synthesis. These files may contain commands necessary for the designer to control the insertion of memory BIST engines into the netlist. According to one embodiment, file 210b allows the designer to have control over the characteristics of the BIST engines and target memory collars and assignment of BIST engines to target memories. In one embodiment, file 210c is the user's HDL design file, and file 210d is the IO specification file. File 210d is a text file that may contain information such as: global keywords, which defines chip-level and technology information relevant to the design; JTAG_Inline data, which is used to guide the construction of the IEEE 1149.1 Test Access Port (TAP); Port Declarations, which define all top level chip I/O and how they are connected to the core or to custom logic within the top level hierarchy; and Enable Declarations, which are used to specify both the system mode and test mode operation of three-state driver enable controls. File 210e, in one embodiment, is a connection file configured to permit custom connection and to instantiate additional logic at the top-level by describing unique logic configurations that cannot be described by file 210d alone.

2.2 DFT Planner Interface

Figure 3:
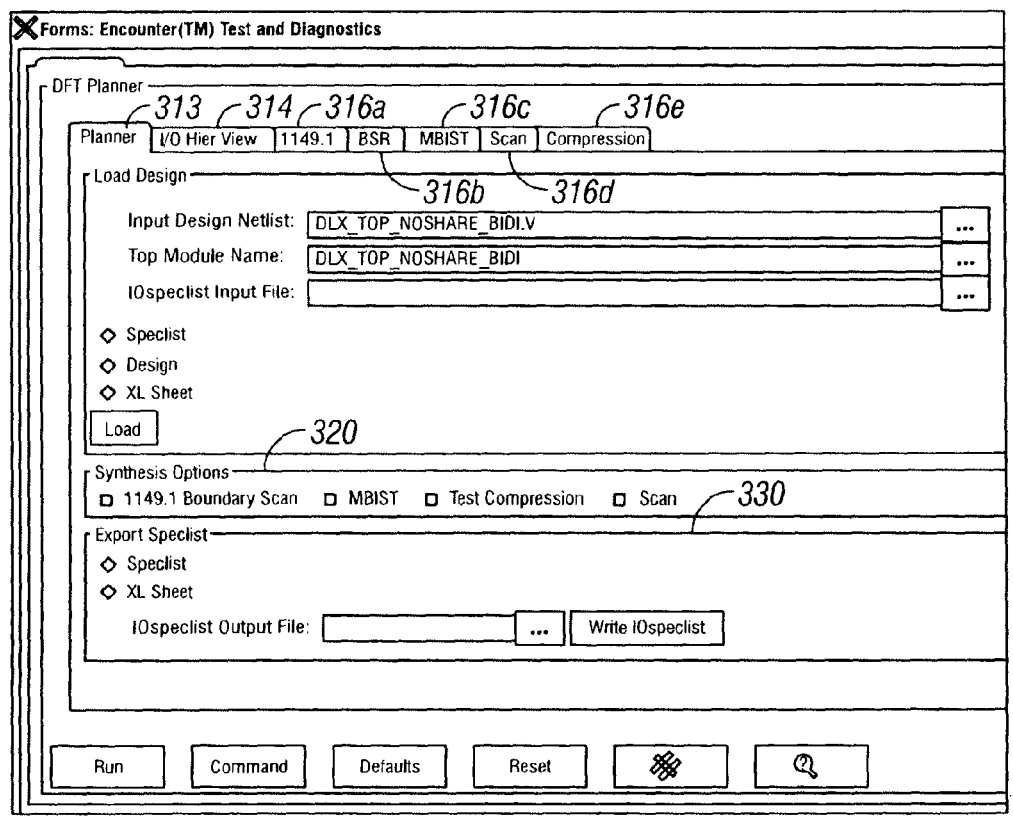
FIG. 3 illustrates an example graphical user interface of a DFT Planner according to one embodiment of the present invention.

FIG. 3 illustrates the graphical user's interface (GUI) 110 according to one embodiment of the present invention. The example GUI 110, illustrated in FIG. 3, facilitates the process of selecting test structures to be added to the design at each stage of a test methodology. According to one embodiment, GUI 110 can be configured to provide an architectural top-level layer from which DFTS commands may be run by consolidating current DFTS tools into a common user interface.

In one embodiment, GUI 110 can be configured to allow users to better analyze the various DFTS options and scenarios that are available along with the necessary inputs, all from one interface. Additionally, GUI 110 can be configured to minimize the amount of tool-specific knowledge needed to execute test synthesis. DFTS methodologies have traditionally required many user-defined files to be input into various stages of the design flows, which are prone to semantic and syntactical errors. In one embodiment, GUI 110 can be configured to reduce user errors throughout the test synthesis process by providing templates for input files to ensure that data are entered in a valid format. These templates are provided in tabs 316a-316e, which will be displayed to the user once one of the tabs is selected. Additionally, GUI 110 reduces the number of times the user has to reenter cumulative data at various junctions of DFTS methodologies.

The example GUI 110 illustrated in FIG. 3 includes a planner tab 312, a I/O hierarchy view tab 314, a IEEE 1149.1 tab 316a, a boundary scan register (BSR) tab 316b, a memory built-in-self-test (MBIST) tab 316c, a scan tab 316d, and a compression tab 316e. Each of these tabs is either enabled or disabled based on the user's selection of a test to be performed in the Synthesis Options portion 320 of GUI 110. For example, tab 316c will be enabled if the MBIST button is selected in Synthesis Options portion 320. Selection of the MBIST button will also enable other required input forms, such as the IEEE 1149.1 tab. As shown in FIG. 1, scan tab 316d is disabled because the scan test button is not selected in Synthesis Options portion 320.

Figure 4A:
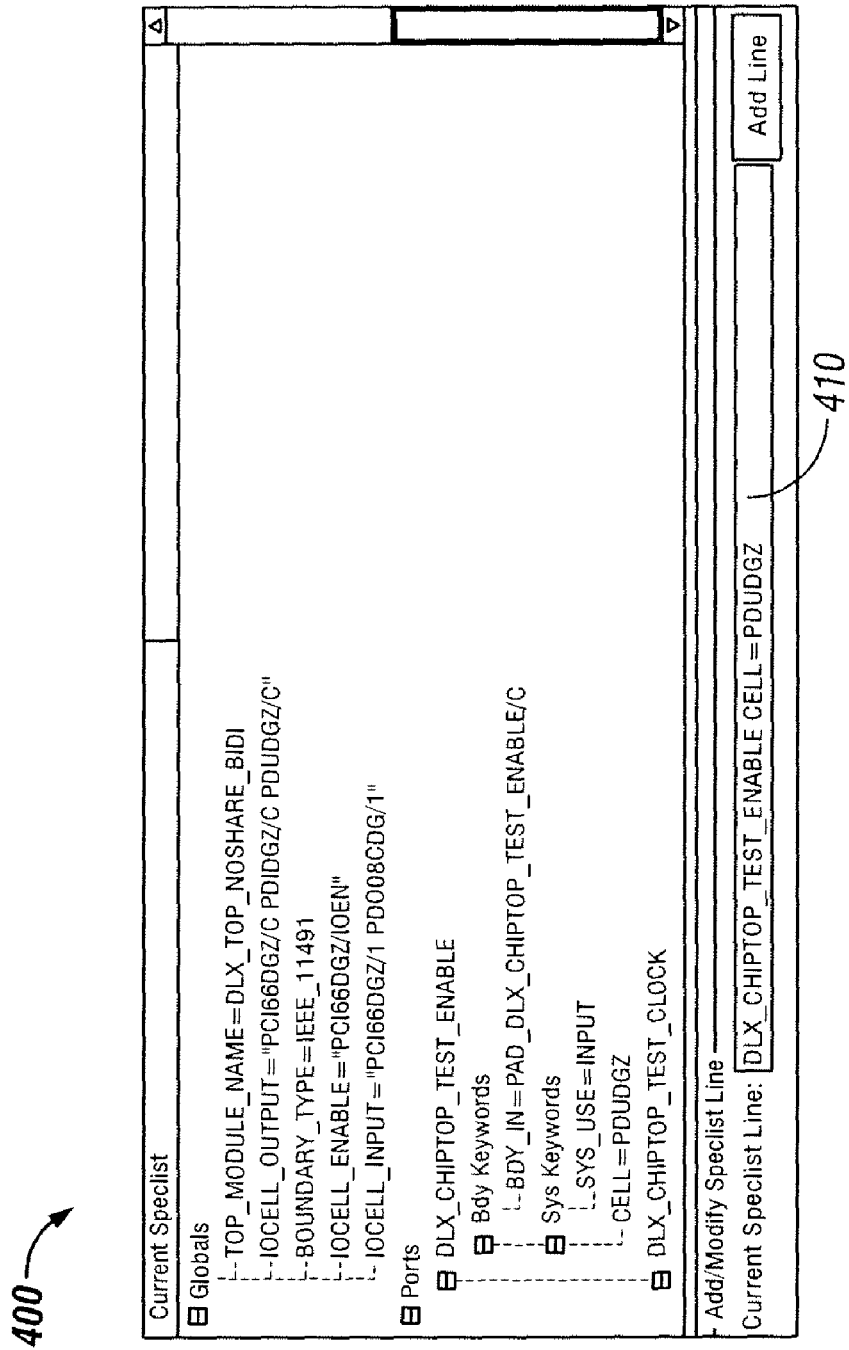
FIG. 4A illustrates an example specification interface of the DFT Planner according to one embodiment of the present invention.

FIG. 4A illustrates an IO specification interface 400 of DFTP 100 according to one embodiment of the present invention. Interface 400 can be used in one embodiment to replace standard DFTS methodologies that rely on multiple user-entered text files (configuration file), each of which may be unique to each other, in order to work with various DFT synthesis components. Standard DFTS methodologies require users to enter test parameters and scripts having complex syntax and format. In working with standard DFTS methodologies, users are frequently asked to reenter the same test parameters or scripts across multiple configuration files. This user environment often leads to mistakes during the script and configuration file generation process. To address this problem, DFTP 100 provides, in one embodiment, a database to store DFT information at each stage of a methodology. DFTP 100 accepts an IO specification file to populate the internal database. The contents of the database can also be displayed, modified, or written out at any stage of a methodology. In one embodiment, the IO specification file is automatically generated by DFTP 100 once the user has entered all of the necessary information based on the requirements of the test synthesis components being executed. An example portion of the IO specification file generated by DFTP 100 is shown in FIG. 4B.

Referring again to FIG. 4A, interface 400 allows users to select an entire line, consisting of a port name and a number of keyword-value pairs, which describe the features of the port required for test synthesis, or they may select a particular keyword, for editing. If the user highlights a port, the port name and all of the keyword-value pairs describing the port, appear in the 'Current Speclist Line' text box 410, whereas if only a keyword-value pair is selected, only it and the associated port name appear. In one embodiment, users may edit the contents of text box 410 when the edited line is semantically and syntactically correct. Preferably, the user may edit the contents of box 410 if and only if the edited line is semantically and syntactically correct. Otherwise, an error message will appear that notifies the user of why the error occurred and how to resolve it. In one embodiment, text box 410 also allows users to add new specification lines or keywords and delete existing ones.

In one embodiment, DFTP 100 can be configured to reduce or eliminate the need for user to manually to build and modify the IO specification by implementing the functionalities of the input and error checking modules 120 and 130. DFTP 100 uses the IO specification information at different stages of the test synthesis process. Some information in the IO specification is stage-specific (e.g., information exclusively for logic BIST) and some is shared and global. Input module 120 of DFTP 100 forwards stage-specific information to the appropriate respective stage and forwards global and shared information to the plurality of DFT synthesis components. In this way, the task of manual editing or re-entering data is reduced or eliminated.

Figure 5:
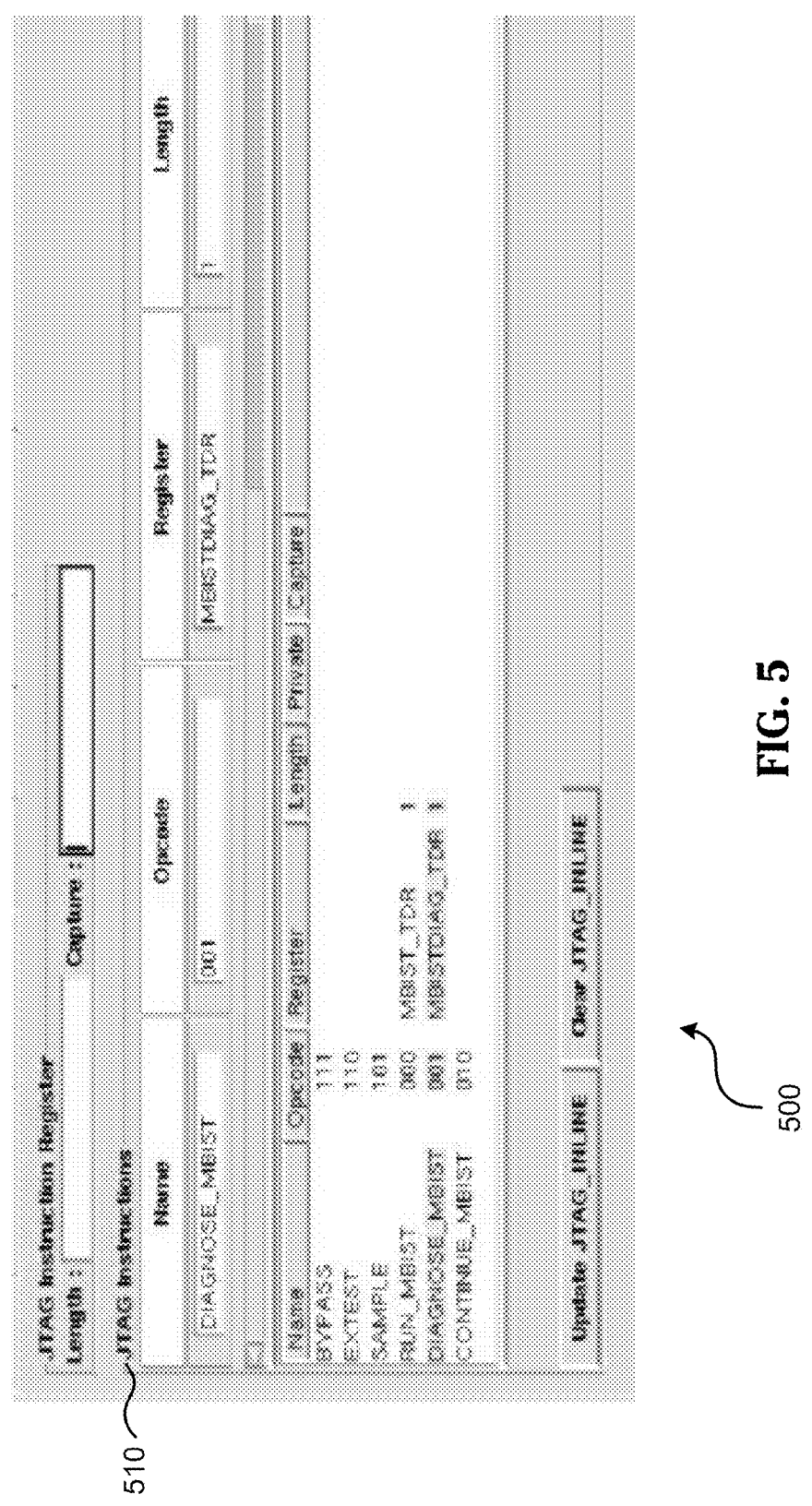

FIG. 5 illustrates a IEEE 1149.1 boundary scan interface 500, which is displayed to the user when tab 314 is selected. Interface 500 contains the boundary scan-related instructions, opcodes, and associated test data registers (TDRs). Interface 500 allows the user to specify and edit instructions for the boundary scan insertion synthesis using Boundary Scan Description Language (BSDL). Interface 500 also includes a boundary scan command structure, also known as JTAG_Inline, display area 510. DFTP 100 can be implemented to automatically populates display area 510 with IEEE 1149.1-compliant BSDL instructions (e.g., BYPASS, EXTEST, and SAMPLE) when the user selects the 1149.1 button in Synthesis Options portion 320. DFTP 100 also assigns a unique opcode for each BSDL instruction. In one embodiment, interface 500 can be configured to allow users to edit the opcode assigned to each BSDL instruction. The user may also add custom IEEE 1149.1 boundary scan instructions and registers in these fields with limited prior knowledge of BSDL semantics and syntax. The JTAG_Inline information is used to eventually generate an IEEE 1149.1-compliant BSDL file.

Similarly, BSR tab 316b takes the user to a BSR interface screen (not shown), which allows the user to easily control the order of the boundary scan cells in the boundary scan register (BSR). The order of the BSR is initially governed by the order of the ports in the generated specification file (i.e. the IO specification file). However, on the DFT Planner's BSR tab, the user may view the boundary cells placed on each port and the position of those boundary cells in the BSR. In one embodiment, the user has the flexibility to easily reorder the BSR simply by clicking and dragging a boundary cell to a different location or by explicitly stating its new desired position in the BSR.

When the MBIST checkbox is selected from the synthesis options portion 320, JTAG_Inline display area 320 is updated with the commands needed to perform MBIST. DFTP 100 can be configured to update display area 320 with default MBIST instructions such as, for example, RUN_MBSIT, CONTINUE_MBIST, and DIAGNOSE_MBIST. Additionally, the appropriate TDRs will also be displayed.

In one embodiment, DFTP 100 can be configured to enable 1149.1 boundary scan button in the synthesis options portion 320 whenever a certain event occurs. In one embodiment, the event is the user selection of the MBIST button. This occurs because DFTP 100 recognizes that a dependency exists between the MBIST and 1149.1 operations. Similarly, the MBIST tab may be configured to become active upon selection of the MBIST checkbox. This tab displays the list of memories found in the netlist. Although not explored in this scenario, the user may also define clocking information and MBIST controller sharing information for memories as shown in FIG. 5.

It should be noted that each of the tabs 316a-316d displays information relevant to the test synthesis involved. Each tab will also display data fields where the user may enter various test parameters and commands. Once all of the data fields in one of the tabs are filled out, information in those data fields that are common with data fields in other tabs will be transferred. In this way, the user does not have to enter information she already has previously entered. Additionally, prior to proceeding with any of the DFT synthesis components, DFTP 100 can be configured to determine whether all of the data fields are entered. For example, in performing boundary scan insertion, DFTP 100 may determine whether the user has entered data such as insertion sequence and pin identification data. As stated, DFTP 100 may prompt the user to enter all of the necessary information into an organized GUI based on the requirements of the test synthesis components being executed. Once all of the data have been entered, DFTP 100 may translate the entered information/command into proper the format and syntax and may reproduce them into the IO specification file for each test synthesis stage, where appropriate.

Although all of the required test data, parameters, and commands necessary to perform each of the test syntheses (e.g., boundary scan, MBIST, logic BIST), are not fully described, they are well known to those skilled in the art. It also known to those skilled in the art that the amount of data required to performed a test synthesis may be manipulated to require more or less data. Any such manipulation would be within the scope of this invention. Further, although GUI 110 does not display an option for performing logic BIST or other test syntheses, such as IEEE 1500 core test, IEEE 1149.6 boundary scan, reduced pin count test (RPCT) and other DFT operations, which can be performed on an integrated circuit, it should be understood that these other test syntheses are logical extension to DFTP 100 and are within the scope of this invention.

2.2 Error Checking

In one embodiment, DFTP 100 can be configured to reduce or preferably eliminate human errors throughout the entire testing process. DFTP 100 may accomplish this task using the error checking functions of error checking module 130 and the data distribution function of input module 120. In one embodiment, input module 120 can be configured to distribute common or global information to various test synthesis components, thus reducing or preferably eliminating the need for the user to re-enter the same information at various stages of the design and test process. For example, for boundary scan insertion, the user is required to specify which pins function as the test data ports (i.e., test-data-in and test-data-out ports). In traditional DFTS methodologies, the user is required to reenter the data port information again if they wish to perform scan insertion. DFTP 100 is able to eliminate this redundancy by identifying all shared and global data and forward them to the proper test synthesis components.

In one embodiment, DFTP 100 uses a top layer approach to plan test synthesis strategies, which results in the sharing of global information amongst various synthesis components. In contrast, there is minimal interaction and information-sharing between tools in point-tool approaches, which in many cases requires the user to input redundant information at various stages of a test methodology. This excess verbosity results in squandered time and makes the DFT flow more prone to input errors. In one embodiment, DFTP 100 provides interaction between tools and information-sharing by providing a single entry point for global information and broadcasting it appropriately to various test synthesis components.

As previously mentioned, DFTP 100 includes an error checking module 130 that can be configured to analyze each data parameter, information, and command entered by the user to determine whether it is in a correct format or syntax. For example, if the user input falls outside the range of acceptable values, error checking module 130 would flag it and immediately notify the user. In this way, the error is caught up front. The error checking function of DFTP 100 saves time and precludes users from discovering errors at later stages in their design flows.

3. DFTP's Synthesis Components

As mentioned, DFTP 100 allows users to view the available test synthesis options and devise a high-level test synthesis plan. In one embodiment, based on the selected options in synthesis options portion 320, the user is prompted to enter common global information required at various stages of the entire synthesis methodology. As described in the following subsections, according to one embodiment, DFTP 100 can be configured to provide interrelation and communication between the test synthesis methods, which reduce the amount of required user input and also facilitates their execution. Boundary scan, MBIST, and test data compression are well known synthesis operations that may all be invoked individually or in combination by DFTP 100. In one embodiment, DFTP 100 can be configured to work with DFT tool such as, for example, Cadence RTL Compiler and Encounter Test. Alternatively, DFTP 100 can also be configured to work with DFT tools such as DFT MAX®, BSD Compiler®, DFTAdvisor®, TestKompress®, MBISTArchitecture®, and BSDArchitect® to perform different types of DFT synthesis. The benefits of controlling each operation from a high level interface, such as GUI 110, rather than using point tools are discussed below.

3.1 Boundary Scan Insertion

As mentioned, boundary scan is one of the synthesis operations performed by DFTP 100. In invoking this operation, boundary scan structures that conform to the IEEE 1149.1 2001 Standard or other standards, may be inserted during test synthesis to facilitate board-level interconnect testing independent of on-chip system logic. To observe and control the functional I/Os of a chip that are independent of arbitrary system logic, a boundary register is defined. In one embodiment, the goal of DFTP 100 is to automate the boundary scan insertion process to the extent that it becomes nearly a push-button solution.

The boundary scan insertion process generally requires users to enter a design netlist, the top module name of the design, and synthesis libraries for I/O cells. This information is common amongst several other test synthesis tools and due to the use of traditional point tool approaches, users are required to re-enter this, and other, information at various stages of a methodology. In one embodiment, DFTP 100 can be configured to require the user specify such common information up front using GUI 110 and to distribute such common information to all other processes or synthesis components that require it. Similarly, the specification of the boundary scan insertion process allows users to optionally specify test and clock information, such as test enable ports, scan enable ports, functional clock ports, test clock ports, and scan in and scan out ports, even though this exact same information is requested while performing scan chain insertion. In one embodiment, DFTP 100 can be configured to request all of this information from GUI 110. This simplifies and optimizes the planning and managing of not only the boundary scan insertion process, but the entire test methodology.

The possibility of user error is further reduced by DFTP 100 as it does not allow invalid combinations of inputs to be entered. For example, in one embodiment where scan chain insertion test was not requested, then DFTP 100 does not allow users to enter scan in, scan out, and scan enable pins data; these input text fields would be deactivated in this scenario.

Boundary scan insertion also involves connecting the five TAP ports, TDI, TDO, TCK, TMS, and optionally, TRST to the JTAG_MACRO, which contains the TAP controller, instruction register and other logic required by the boundary scan architecture. In an embodiment where the TAP ports exist in the netlist with the same names as above, then DFTP 100 can be configured to recognize them and display them in the boundary scan insertion window of GUI 110, which is accessible through tab 316*b*.

In one embodiment where the TAP ports exist in the netlist, but have different names, then users are prompted to specify their names. Upon entering the TAP port names, DFTP 100 may determine whether the specified ports actually exist in the netlist, as an error-checking mechanism. In one embodiment where the TAP ports do not exist in the netlist, users may be prompted to enter the names of the TAP ports they are adding along with their corresponding I/O cells. In this case, checks are performed to ensure that valid I/O cells are specified.

3.2 MBIST Insertion

Memory Built-In-Self-Test (MBIST) is another area that ties into a total DFT solution. Specification of MBIST insertion revolves around determining what memories are in the netlist and their types. Starting the specification of any MBIST product from scratch is always an issue for the user. In one embodiment, DFTP 100 can be implemented to avoid requiring the user to memorize tool specific commands and protocols. In one embodiment, DFTP 100 includes a library of commands for each DFT synthesis component (e.g., MBIST). In this way, the user can focus on a working solution rather on proper command syntax.

An input that DFTP 100 may require in order to generate the starting point for MBIST is a list of library (.lib) files for the memory types in the netlist. From this user-provided list of library files, which could be defined as part of the general library specification, the netlist may be processed to locate and record any and preferably all instances of the memories found in the netlist. The recorded list of identified memory instances may be used to generate an MBIST specification template that can insert a single MBIST controller for each memory into the netlist. This template may be presented to the user to add some clocking information. The necessary information may include the name of the chip clock pins that may be used to drive the MBIST controllers, the clock frequency of those pins, and the frequency of the clocks at the memories. In one embodiment, DFTP 100 can be configured to collect additional information from the user such as, for examples, items like sharing, failure recording, and physical information of the memories.

FIG. 6 illustrates a list of memory instances that can be grouped according to one embodiment of the present invention. In one embodiment, DFTP 100 can be configured to provide an interface (not shown) that is organized similar to the table shown in FIG. 5 for entering information regarding memory instances. The memories in the list can be grouped by placing an integer next to the memory instance listed, as seen in the first column of the table. The common integer value itself has no meaning, but memory instances with a common integer value may be grouped as being shared in the MBIST specification. Dynamic checks on the memory type against the MBIST sharing rules may allow or disallow placing a memory instance into a group. In one embodiment where a memory has not been included in a group, which is indicated by leaving the first column blank, it is assumed to be in a group of its own and may be controlled by its own MBIST controller.

With this level of abstraction, the user may focus on concocting a high-level memory testing strategy instead of on the details of how to specify a tool-specific format.

3.3 Scan Chain Insertion

Scan chain insertion is typically one of the final test synthesis phases. Scan chains increase the testability of the design by allowing automated test equipment (ATE) easy access to all of the flops (i.e. state elements) in the design. In addition to controlling and observing the chip inputs and outputs, ATE can set the state of the circuit by scanning in test data through the scan chains and observing circuit response by scanning data out of the chains. During the scan insertion process, each flop in the design is preferably verified against a set DFT rules for scan. These DFT rules confirm that the flop is controllable from an accessible test clock and ensure that the data in the flop cannot get corrupted. Next, the flops are converted into scan flops, and are chained together into scan chains.

In one embodiment, DFTP 100 can be configured to automatically invoke scan chain testing tool such as, for example, Cadence RTL Compiler. RTL Compiler is used to insert scan chains into the design. In one embodiment, DFTP 100 can be implemented to facilitate the user to specify the scan configuration for the design. To verify that the requirements for scan are satisfied, the user preferably should specify 'test-mode' pins; these are pins that can be held to a specific value during the entire test process. Also, shift-enable pins need to be specified. These pins can be held to a specific value while data is being shifted through the scan chains, but not when the test is being applied. Finally, 'test clock' pins can be specified. These clocks can be used to shift the data through the scan chains. In addition the scan configuration needs to be specified—the number of scan chains to be inserted and what pins will be used for scan input and scan output. Multiple chains are typically loaded in parallel to reduce the time required to load and unload the test data. In some cases, existing functional pins can be shared as scan in or scan out pins. In one embodiment, all of this information is preferably specified in a single form within DFTP 100. The information specified here can be shared across all synthesis processes requiring it, such as boundary scan and MBIST insertion. For example, pins specified here as solely dedicated to test do not need boundary scan cells inserted. Furthermore, DFTP may ensure that scan pins are specified only on valid I/O locations according to the physical pin map. Boundary scan and MBIST insertion typically make use of the 'test-mode' and 'shift-enable' pins—again the information entered here by the user will be used at each test synthesis phase, but is entered in only one place, DFTP 100.

3.4 Test Compression Insertion

As previously mentioned, DFTP 100 includes other tool module 135. In one embodiment, module 135 may be a compression insertion test module which includes a specialized circuit called a Compression Macro. The compression macro circuit allows the scan chain lengths to be reduced and leads to reduced test time and test data volume. In one embodiment, DFTP 100 supports two different compression architectures: combinational-network-based (e.g. XOR) and sequential-based-based (e.g. MISR). DFTP 100 can be configured to simplify the process of test compression insertion by prompting users only for necessary input based on the desired compression type. When the 'Test Compression' option is selected from the Planner Page, radio buttons for various compression options may become active and the user may only select one of them. Depending on the selected compression type, the user is presented with a set of required input options. This prevents users from entering invalid information. For example, in the case of MISR compression, users may specify whether to use unidirectional or bidirectional I/O cells.

4.0 DFTP Process Flow

Figure 7:
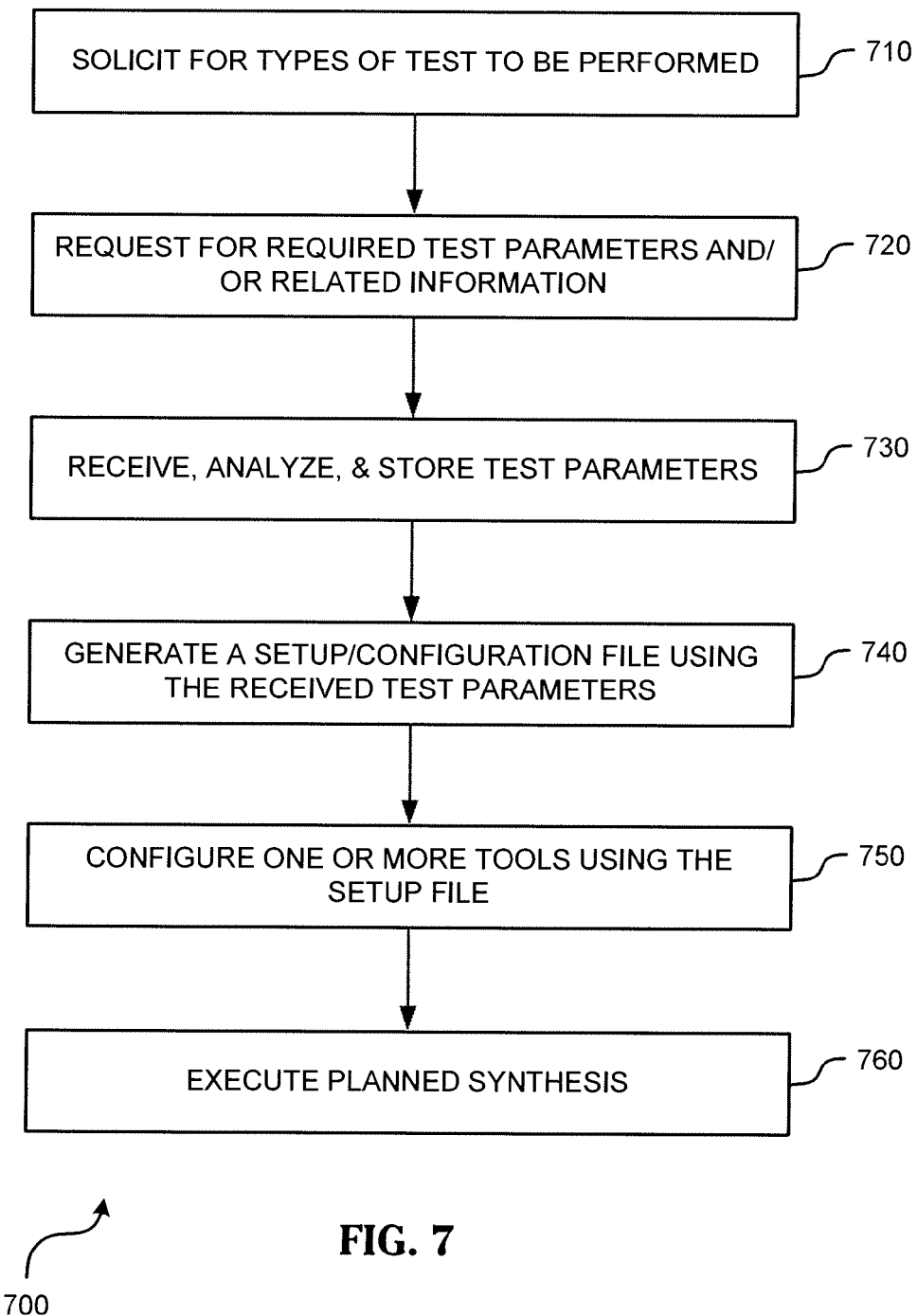
FIGS. 7-9 illustrate examples of flow charts implemented by DFT Planner according to embodiments of the present invention.

FIG. 7 illustrates a flow diagram of a method 700 implemented by DFTP 100 for testing an integrated circuit according to one embodiment of the present invention. Referring now to FIG. 7, in block 710, DFTP 100 is configured to prompt the user for the synthesis operations the user wants to perform on the circuit. For example, in one embodiment, the user may select which of the plurality of synthesis operations to perform on the circuit using the options portion 320 of GUI 110.

In a block 720, DFTP 100 is configured to request test parameters and commands. This can be done by, for example, enabling any of tabs 316a-e and by prompting the user to preferably enter all of the necessary information.

In a block 730, DFTP 100 receives, analyzes, and stores the test parameters and commands. Prior to proceeding with any of the DFT synthesis components, in one embodiment, DFTP 100 checks to see whether some or all of required data fields are entered in block 720. Additionally, in one embodiment, DFTP 100 performs a testability and design impact analysis. The testability and design impact analysis performs analyses on the selected synthesis operations and calculates the impacts on the design, such as, but not limited to, power impact, area impact, and timing impact. This allows design architects to preview the tradeoffs between benefits and impacts of various design parameter selections, before committing to a methodology and implementing logic transformations.

In block 740, DFTP 100 generates an IO specification, based on an analysis of the netlist and test parameters entered by the user. The automatic generation of the IO specification helps eliminate the need for the user to create it manually. This helps reduce errors throughout the DFTS methodologies.

In a block 750, DFTP 100 uses the IO specification to configure one or more of the DFT synthesis tools or components. The number of tools to be configured by DFTP 100 depends on the number and the types of tests selected by the user in the Synthesis Options portion 320 in block 710. In order to properly test a circuit, preferably each DFT synthesis component must be configured using the test parameters collected by GUI 110. Some test parameters are shared among several DFTS components. Some test parameters are unique to a certain DFTS component. In one embodiment, DFTP 100 is configured to distribute these test parameters to the appropriate DFTS components. In this way, each DFTS component is supplied with essential test parameters (e.g., port and memory information) needed to perform a logical transformation on the circuit.

In a block 760, one or more of the configured tools from DFT tools module 115 is called to perform the synthesis. In one embodiment, DFTP 100 may use its own built-in tools to perform any of the DFT syntheses. For example, in one embodiment, DFTP 100 uses CAD synthesis tools such as, for example, Cadence RTL Compiler and Encounter Test to perform DFT insertion, scan chain synthesis, compression insertion, boundary scan insertion, scan chain insertion, DFT analysis, automatic test pattern generation (ATPG), and fault diagnostics. Alternatively, DFTP 100 may invoke one or more tools from other tools module 135. In one embodiment, tools module 135 may include the following software tools or applications: DFT Compiler tool for insertion scan test; DFT MAX® tool for compression insertion test; BSD Compiler® tool for boundary scan test; DFTAdvisor® tool for scan chain insertion; TestKompress® tool for compression insertion test; MBISTArchitecture® for memory BIST insertion test; and BSDArchitect® for boundary scan insertion test.

In one embodiment, DFTP 100 can be configured to use an encapsulated DFTS approach, meaning each software tool or application may be invoked individually and independently. Once a synthesis operation is completed, DFTP 100 may invoke another operation until the entire or desired DFT test plan is carried out. In this mode, each operation or tool may execute other subordinate scripts/commands to progress through the DFT synthesis plan. Alternatively, in one embodiment of the present invention, DFTP 100 uses an integrated approach, meaning all test applications or tools are executed and control within DFTP 100 application.

Figure 8:
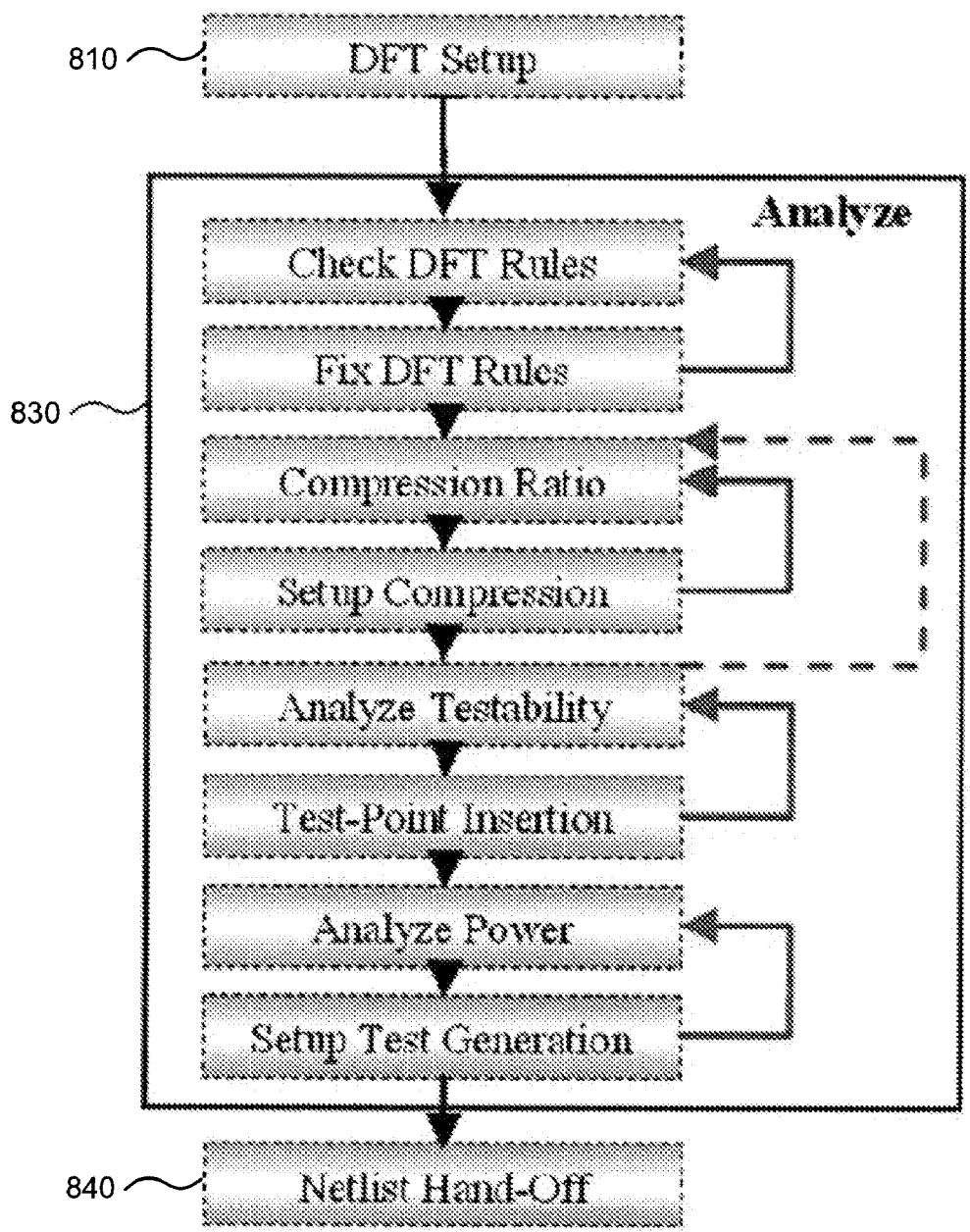

FIG. 8 illustrates a flow diagram of a method 800 implemented by DFTP 100 for planning a synthesis strategy for an integrated circuit according to another embodiment of the present invention. Referring now to FIG. 8, in a block 810, DFTP 100 is being set up. In this block, the user may select which of the DFT syntheses to perform on the DUT. DFTP 100 may also request the user to enter some or preferably all of the test data and parameters needed to perform the selected DFT syntheses. Although all of the required test data, parameters, and commands necessary to perform each of the test syntheses (e.g., boundary scan, MBIST, logic BIST), are not fully described, they are well known to those skilled in the art. It also known to those skilled in the art that the amount of data required to perform a test synthesis may be manipulated to require more or less data. Any such manipulation would be within the scope of this invention.

In block 830, DFTP 100 carries out one or more of the DFT syntheses. In one embodiment, this can be done by first performing error checking routines on DFT rules and commands. If any error is found, the error is corrected before proceeding with the test plan. As shown in block 830, depending on the user's setting, DFTP 100 may setup and perform one or more of the following: compression ratio test, analyze testability, area overhead analysis, test-point insertion, analyze power, and setup test generation. Upon completion of block 830, DFTP 100 executes a netlist hand-off in a block 840.

Figure 9:
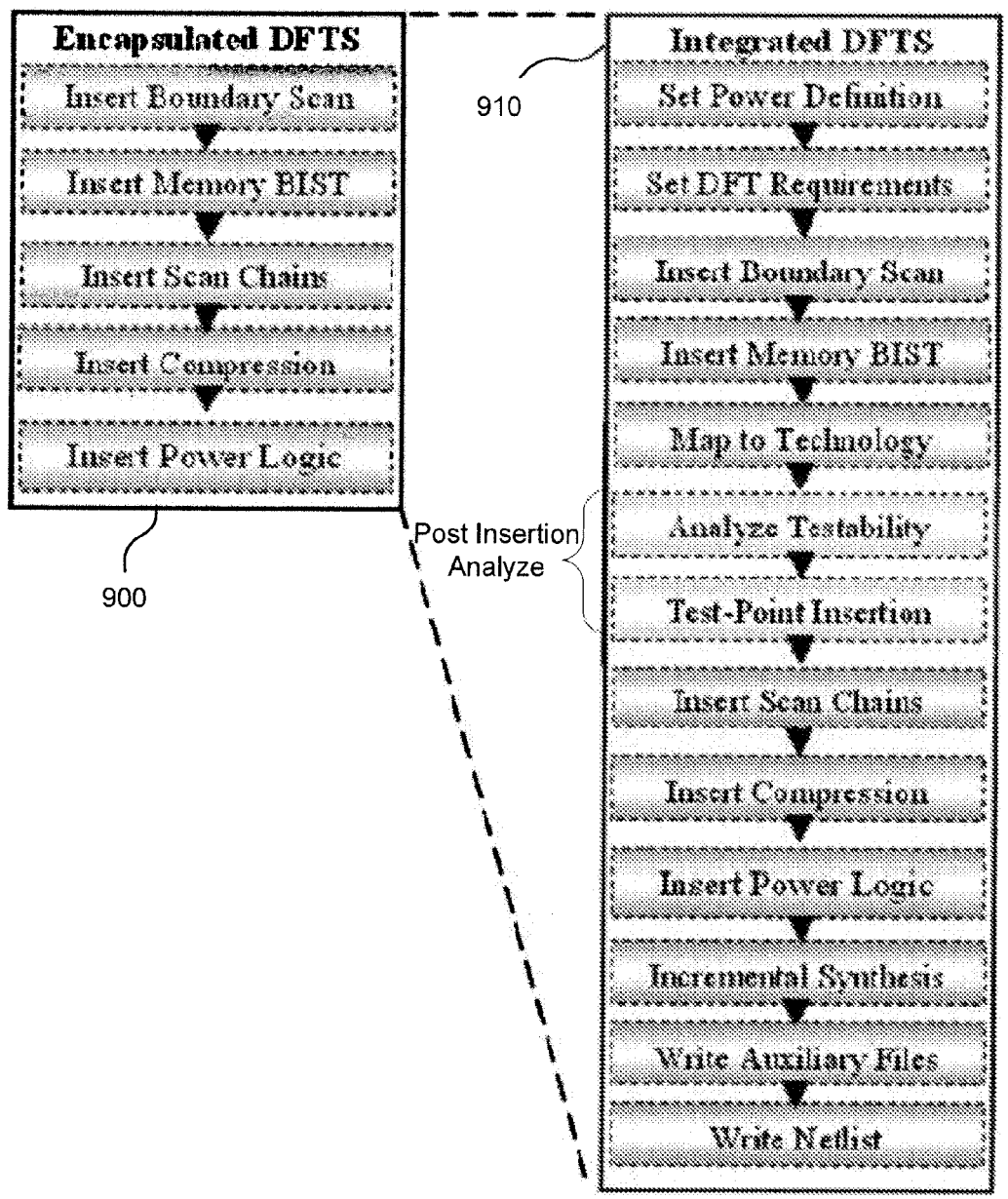

As previously mentioned, DFTP 100 may use an encapsulated or integrated DFTS approach. FIG. 9 illustrates the relationship between these two approaches. Referring now to FIG. 9, a box 910 illustrates the encapsulated DFTS approach. A box 920 illustrates the integrated DFTS approach. It should be noted that either approach (i.e., encapsulated or integrated) may be used to perform any desired DFT synthesis strategies. For example, the user may choose to execute a DFT synthesis strategy where only an insert boundary scan and insert embedded tests are performed.

As shown in box 910, in one embodiment, DFTP 100 is instructed to execute 5 DFT syntheses: insert boundary scan, insert embedded scan, insert scan chains, insert compression, and insert PTAM. Although the tests are executed in the order shown, the order of the test performed may be different. Box 920 shows the same 5 DFT syntheses carried out by DFTP 100, but using the integrated approach.

Unless defined otherwise, all technical and scientific terms used herein have the same meaning as is commonly understood by one of ordinary skill in the art to which this invention belongs. All patents, applications, published applications and other publications referred to herein are incorporated by reference in their entirety. If a definition set forth in this section is contrary to or otherwise inconsistent with a definition set forth in applications, published applications and other publications that are herein incorporated by reference, the definition set forth in this section prevails over the definition that is incorporated herein by reference.

Figure 10:
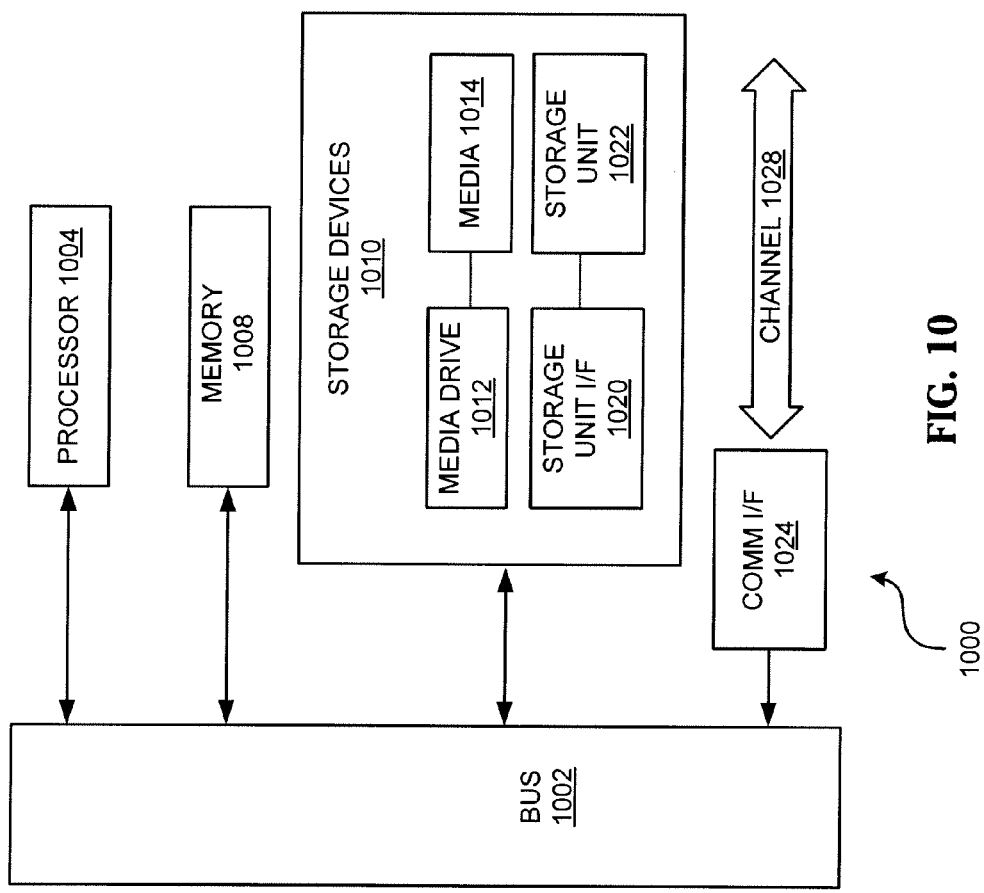
FIG. 10 illustrates an exemplary computer system in which the DFT Planner can be implemented.

The term tool can be used to refer to any apparatus configured to perform a recited function. Tools can include a collection of one or more modules and can also be comprised of hardware, software or a combination thereof. Thus, for example, a tool can be a collection of software modules, hardware modules, software/hardware modules or any combination or permutation thereof. As another example, a tool can be a computing device or other appliance on which software runs or in which hardware is implemented.

Where components or modules of the invention are implemented in whole or in part using software, in one embodiment, these software elements can be implemented to operate with a computing or processing module capable of carrying out the functionality described with respect thereto. One such example computing module is shown in FIG. 10. Various embodiments are described in terms of this example computing module 1000. After reading this description, it will become apparent to a person skilled in the relevant art how to implement the invention using other computing modules or architectures.

Referring now to FIG. 10, computing module 1000 may represent, for example, computing or processing capabilities found within desktop, laptop and notebook computers; handheld computing devices (PDA's, smart phones, cell phones, palmtops, etc.); mainframes, supercomputers, workstations or servers; or any other type of special or general purpose computing devices as may be desirable or appropriate for a given application or environment. Computing module 1000 might also represent computing capabilities embedded within or otherwise available to a given device. For example, a computing module might be found in other electronic devices such as, for example, digital cameras, navigation systems, cellular telephones, modems, routers, WAPs, and any other electronic device that might include some form or processing capabilities.

Computing module 1000 might include one or more processors or processing devices, such as a processor 1004. Processor 1004 might be implemented using a general-purpose or special-purpose processing engine such as, for example, a microprocessor, controller, or other control logic. In the example illustrated in FIG. 10, processor 1004 is connected to a bus 1002 or other communication medium to facilitate interaction with other components of computing module 1000.

Computing module 1000 might also include one or more memory modules, referred to as main memory 1008. For example, preferably random access memory (RAM) or other dynamic memory, might be used for storing information and instructions to be executed by processor 1004. Main memory 1008 might also be used for storing temporary variables or other intermediate information during execution of instructions to be executed by processor 1004. Computing module 1000 might likewise include a read only memory ("ROM") or other static storage device coupled to bus 1002 for storing static information and instructions for processor 1004.

The computing module 1000 might also include one or more various forms of information storage mechanism 1010, which might include, for example, a media drive 1012 and a storage unit interface 1020. The media drive 1012 might include a drive or other mechanism to support fixed or removable storage media 1014. For example, a hard disk drive, a floppy disk drive, a magnetic tape drive, an optical disk drive, a CD or DVD drive (R or RW), or other removable or fixed media drive. Accordingly, storage media 1014, might include, for example, a hard disk, a floppy disk, magnetic tape, optical disk, a CD or DVD, or other fixed or removable medium that is read by, written to or accessed by media drive 1012. As these examples illustrate, the storage media 1014 can include a computer usable storage medium having stored therein particular computer software or data.

In alternative embodiments, information storage mechanism 1010 might include other similar instrumentalities for allowing computer programs or other instructions or data to be loaded into computing module 1000. Such instrumentalities might include, for example, a fixed or removable storage unit 1022 and an interface 1020. Examples of such storage units 1022 and interfaces 1020 can include a program cartridge and cartridge interface, a removable memory (for example, a flash memory or other removable memory module) and memory slot, a PCMCIA slot and card, and other fixed or removable storage units 1022 and interfaces 1020 that allow software and data to be transferred from the storage unit 1022 to computing module 1000.

Computing module 1000 might also include a communications interface 1024. Communications interface 1024 might be used to allow software and data to be transferred between computing module 1000 and external devices. Examples of communications interface 1024 might include a modem or softmodem, a network interface (such as an Ethernet, network interface card, WiMedia, 802.XX or other interface), a communications port (such as for example, a USB port, IR port, RS232 port Bluetooth interface, or other port), or other communications interface. Software and data transferred via communications interface 1024 might typically be carried on signals, which can be electronic, electromagnetic, optical or other signals capable of being exchanged by a given communications interface 1024. These signals might be provided to communications interface 1024 via a channel 1028. This channel 1028 might carry signals and might be implemented using a wired or wireless medium. Some examples of a channel might include a phone line, a cellular phone link, an RF link, an optical link, a network interface, a local or wide area network, and other wired or wireless communications channels.

In this document, the terms "computer program medium" and "computer usable medium" are used to generally refer to media such as, for example, memory 1008, storage unit 1020, media 1014, and signals on channel 1028. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1000 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the blocks are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for performing a test on a circuit design, the method comprising:
    using a computer system to identify a plurality of tests to be performed on the circuit design, wherein the circuit design is defined by a netlist and implementing the plurality of tests on the circuit design comprises performing a plurality of test synthesis operations;
    receiving, via a common interface, a first set of test parameters for performing the plurality of tests on the circuit design;
    calculating an impact on a performance aspect of the circuit design when the plurality of test synthesis operations is performed on the circuit design according to the first set of test parameters; and
    configuring performance of the plurality of tests on the circuit design using the first set of test parameters and the impact on the performance aspect, wherein configuring performance of the plurality of tests comprises generating a setup file based on the first set of test parameters, and the setup file is configured to setup a tool to perform a test within the plurality of tests.

2. The method of claim 1, wherein the performance aspect comprises an area overhead value of a feature of the circuit, a timing value of a feature of the circuit, a compression ratio of the circuit, or a power usage of the circuit.

3. The method of claim 1, further comprising:
    extracting a second set of test parameters based on an analysis of the impact on the performance aspect; and
    calculating a second impact on the performance aspect with the second set of test parameters, and wherein configuring comprises performing the identified test using the second set of test parameters.

4. The method of claim 1, wherein configuring performance of the plurality of tests comprises configuring a plurality of tools with the first set of test parameters to perform the plurality of tests on the circuit.

5. The method of claim 4, wherein the common interface solicits required test parameters for the plurality of tools.

6. The method of claim 4, further comprising distributing a common test parameter from the first set of test parameters to the plurality of tools.

7. The method of claim 4, wherein configuring performance of the plurality of tests further comprises:
configuring a first tool compiler tool for insertion scan test;
configuring a second tool for compression insertion test;
configuring a third tool for boundary scan test;
configuring a fourth tool for scan chain insertion;
configuring a fifth tool for compression insertion test;
configuring a sixth tool for memory BIST insertion test; and
configuring a seventh tool for boundary scan insertion test.

8. The method of claim 1, wherein the plurality of tests comprise scan test, insertion scan test, memory BIST test, logic BIST test, and compression insertion test.

9. The method of claim 1, further comprising performing an error check on the first set of test parameters.

10. The method of claim 9, wherein performing the error check comprises checking the first set of test parameters for syntax or formatting error.

11. A computer program product for performing a test on a circuit design, the computer program product having computer readable program code embedded in a non-transitory computer useable storage medium, the computer readable program code configured to cause a computer system to perform the following operations:
identify a plurality of tests to be performed on the circuit, wherein the circuit design is defined by a netlist and implementing the list of tests on the circuit design comprises performing a plurality of test synthesis operations;
receive, via a common interface, a first set of test parameters for performing the plurality of tests on the circuit design;
calculate an impact on a performance aspect of the circuit design when the plurality of test synthesis operations is performed on the circuit design according to the first set of test parameters; and
configure performance of the plurality of tests on the circuit design using the first set of test parameters and the impact on the performance aspect, wherein configuring performance of the plurality of tests comprises generating a setup file based on the first set of test parameters, and the setup file is configured to setup a tool to perform a test within the plurality of tests.

12. A computer aided design apparatus for performing test on a circuit design, comprising:
a graphical user interface; and
a processor coupled to the graphical user interface, the processor configured to:
receive, via the graphical user interface, from a user a list of tests to perform on the circuit design, wherein the circuit design is defined by a netlist and implementing the list of tests on the circuit design comprises performing a plurality of test synthesis operations;
receive, via the graphical user interface, from the user a first set of test parameters for performing the list of tests on the circuit design;
calculate an impact on a performance aspect of the circuit design when the plurality of test synthesis operations is performed on the circuit design according to the first set of test parameters; and
configure a testing tool to perform the list of tests on the circuit design using the first set of test parameters and based on the impact on the performance aspect, wherein configuring performance of the plurality of tests comprises generating a setup file based on the first set of test parameters, and the setup file is configured to setup a tool to perform a test within the plurality of tests.

13. The computer aided design apparatus of claim 12, wherein the processor is further configured to distribute a common test parameter from the first set of test parameters to the plurality of tools.

14. The computer aided design apparatus of claim 12, wherein the processor is further configured to perform an error check on the first set of test parameters.

15. The computer aided design apparatus of claim 14, wherein performing the error check comprises checking the first set of test parameters for syntax error.

16. The computer aided design apparatus of claim 12, wherein the plurality of tools comprises:
a first tool to perform insertion scan test;
a second tool to perform compression insertion test;
a third tool to perform boundary scan test;
a fourth tool to perform scan chain insertion;
a fifth tool to perform compression insertion test;
a sixth to perform memory BIST insertion test; and
a seventh to perform boundary scan insertion test.

17. The computer aided design apparatus of claim 12, wherein the performance aspect comprises an area overhead value of a feature of the circuit, a timing value of a feature of the circuit, a compression ratio of the circuit, or a power usage of the circuit.

18. The computer aided design apparatus of claim 12, wherein the processor is further configured to:
extract a second set of test parameters based on an analysis of the impact on the performance aspect; and
calculate a second impact on the performance aspect with the extracted test parameters, and wherein configuring comprises performing the list of tests using the extracted test parameters.

* * * * *